United States Patent [19]

Rokurohta et al.

[11] Patent Number: 4,894,895

[45] Date of Patent: Jan. 23, 1990

[54] METHOD OF MAKING AN ULTRASONIC PROBE

[75] Inventors: Haruyasu Rokurohta; Kazufumi Ishiyama, both of Otawara, Japan

[73] Assignee: Kabushiki Kaisha Toshiba, Kawasaki, Japan

[21] Appl. No.: 295,745

[22] Filed: Jan. 11, 1989

Related U.S. Application Data

[62] Division of Ser. No. 157,785, Feb. 19, 1988.

[30] Foreign Application Priority Data

Feb. 24, 1987 [JP] Japan .................................. 62-39158

[51] Int. Cl.[4] .............................................. H01L 41/22

[52] U.S. Cl. .................................. 29/25.35; 310/327; 310/335; 310/365; 73/632

[58] Field of Search ............... 310/334, 335, 365, 366, 310/327; 29/25.35; 73/632

[56] References Cited

U.S. PATENT DOCUMENTS 4,734,963 4/1988 Ishiyama ............................ 29/25.35

4,747,192 5/1988 Rokurota ............................ 29/25.35

*Primary Examiner*—Carl E. Hall

*Attorney, Agent, or Firm*—Oblon, Spivak, McClelland, Maier & Neustadt

[57] ABSTRACT

A method of making an ultrasonic probe having a piezoelectric vibrator composed of an array of piezoelectric vibrator elements, and an electrode plate having as many electrode patterns as the number of the piezoelectric vibrator elements. The piezoelectric vibration elements and the electrode patterns are electrically connected to each other by an auxiliary electrode plate disposed therebetween.

1 Claim, 9 Drawing Sheets

METHOD OF MAKING AN ULTRASONIC PROBE

This is a division of application Ser. No. 07/157,785, filed Feb. 19, 1988.

BACKGROUND OF THE INVENTION

The present invention relates to an ultrasonic probe composed of a piezoelectric vibrator comprising an array of piezoelectric vibrator elements and an electrode plate with as many electrode patterns as the number of the piezoelectric vibrator elements, the piezoelectric vibrator elements and the electrode patterns being electrically connected to each other.

Ultrasonic probes having planar piezoelectric vibrators are heretofore known in the art. Other known ultrasonic probes have concave or convex piezoelectric vibrators for converging or diverging transmitted or received ultrasonic beams. Two electrode lead structures are known as described below.

One electrode lead structure is known as a wire bonding system in which, as shown in FIG. 10 of the accompanying drawings, wires 2 extend respectively from a lateral side 1*a* of one edge of a piezoelectric vibrator 1 and are connected to electrode patterns 3*a*, respectively, of an electrode plate 3. Alternatively, as shown in FIG. 11, wires 2 extending respectively from an upper side of one edge of a piezoelectric vibrator 1 are connected to electrode patterns, respectively, of an electrode plate 3.

The other electrode lead arrangement is an FPC (flexible printed circuit) system proposed by the inventor in Japanese Laid-Open Patent Publication No. 60-259247. As shown in FIG. 12, a first semicircular backing member 4B having a prescribed curvature has a surface on which a second backing member 4A is fixedly mounted. A piezoelectric vibrator array 1 is secured to the surface of the second backing member 4A. A matching layer 14 is fixed to the surface of the piezoelectric vibrator array 1, thus providing an ultrasonic probe body. An FPC plate 5 is attached to a side of the ultrasonic probe body. The FPC plate 5 comprises a plurality of thin laminated pieces 5*a* through 5*f* and having distal ends contacting the piezoelectric vibrator 1, the distal ends being divided into different groups 5*a*′ through 5*f*′. The opposite ends of the thin laminated pieces 5*a* through 5*f* are also grouped into connectors 6*a* through 6*f*. Electrode lines L are formed on the thin lamianted pieces 5*a* through 5*f*.

The arrangement shown in FIG. 10 is disadvantageous in that the configuration of the lateral side 1*a* of the piezoelectric vibrator 1 is often irregular, and that the thickness H of the piezoelectric vibrator 1 is small and so is the dimension of the lateral side 1*a*, with the result that no sufficient space is available for bonding the wires. According to the scheme shown in FIG. 11, since the wires 2 coupled to the upper side 1*b* of the piezoelectric vibrator 1 are curved upwardly, they would obstruct an acoustic matching layer on the piezoelectric vibrator 1.

With the FPC system, difficulty is experienced in making piezoelectric vibrator elements at sufficiently small pitches in a pattern of a small radius of curvature.

SUMMARY OF THE INVENTION

In view of the aforesaid problems of the conventional arrangements, it is an object of the present invention to provide an ultrasonic probe which have wires that provide no obstacle to an acoustic matching layer and other important components and which can be of any desired shape in an ultrasonic scanning direction irrespective of the thickness of a piezoelectric vibrator used, and also to provide a method of manufacturing such an ultrasonic probe.

To achieve the above object, there is provided an ultrasonic probe having a piezoelectric vibrator composed of an array of piezoelectric vibrator elements, an electrode plate having electrode patterns, and an auxiliary electrode plate disposed between and interconnecting the piezoelectric vibrator elements and the electrode patterns.

With the auxiliary electrode plates, wires do not provide an obstacle to an acoustic matching layer and other important components. As with the piezoelectric vibrator, the auxiliary electrode plate is divided into elements. Therefore, the auxiliary electrode plate is flexible enough to be shaped to any desired curvature. By bonding the wires to the auxiliary electrode plate, the ultrasonic probe may be of any desired configuration in an ultrasonic scanning direction regardless of the thickness of the piezoelectric vibrator. For example, the ultrasonic probe may be of a linear shape, a convex shape, a corrugated shape, a concave shape, or the like.

The above and other objects, features and advantages of the present invention will become more apparent from the following description when taken in conjunction with the accompanying drawings in which preferred embodiments of the present invention are shown by way of illustrative example.

DESCRIPTION OF THE PREFERRED EMBODIMENTS

Figure 1:
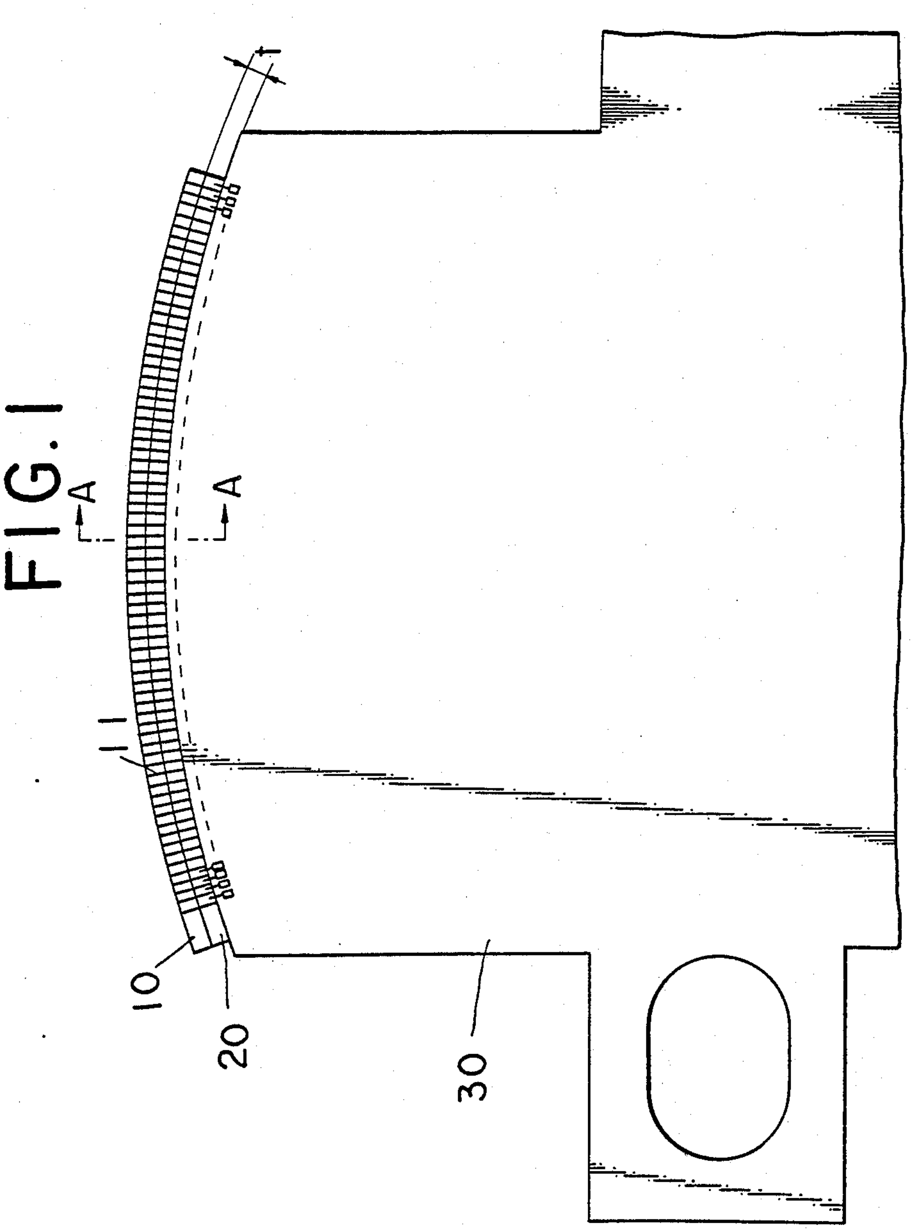
FIG. 1 is a front elevational view of an ultrasonic probe according to an embodiment of the present invention.
Figure 2:
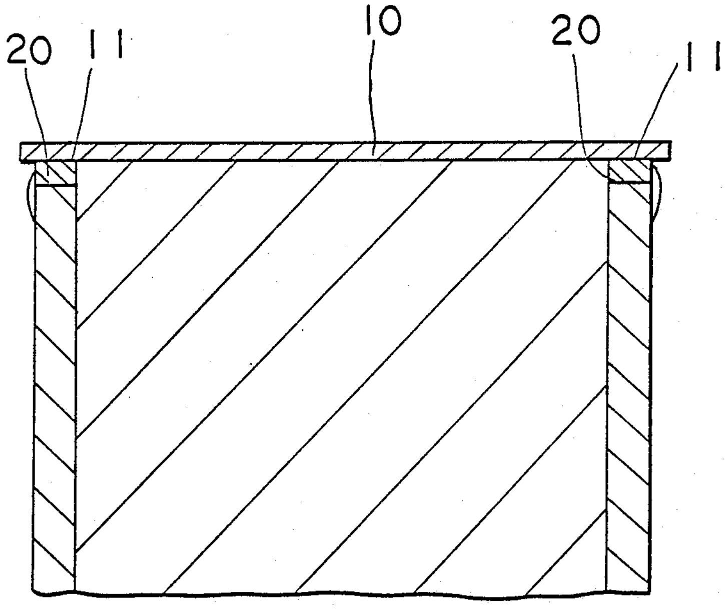
FIG. 2 is a cross-sectional view taken along line A—A of FIG. 1.

As shown in FIGS. 1 and 2, an ultrasonic probe according to an embodiment of the present invention comprises a convex piezoelectric vibrator 10 composed of an array of piezoelectric vibrator elements 10A, a pair of auxiliary electrode plates 20 disposed below side edges of the piezoelectric vibrator 10 and each having as many divided elements as the number of the piezoelectric vibrator elements 10A, and a pair of printed-circuit (PC) boards 30 serving as electrode plates each having as many electrode patterns 32 (FIG. 3) as the number of the divided elements of the auxiliary electrode plate 20, the printed-circuit boards 30 being disposed below the auxiliary electrode plates 20. The piezoelectric vibrator 10, the auxiliary electrode plates 20, and the PC boards 30 are supported on an ultrasonic absorbent 40. The divided elements of the auxiliary electrode plates 20 are electrically connected to the electrode patterns 32 of the PC boards 30 by means of wires 31.

As shown in FIG. 2, the auxiliary electrode plates 20 are disposed underneath the opposite side edges of the piezoelectric vibrator 10. The auxiliary electrode plates 20 have joint portions 11 electrically connected to the piezoelectric vibrator 10 by an electrically conductive adhesive or soldering. The auxiliary electrode plates 20 are initially plated with a layer such as a gold pattern layer capable of wire bonding, or are made of a material capable of wire bonding.

Figure 3:
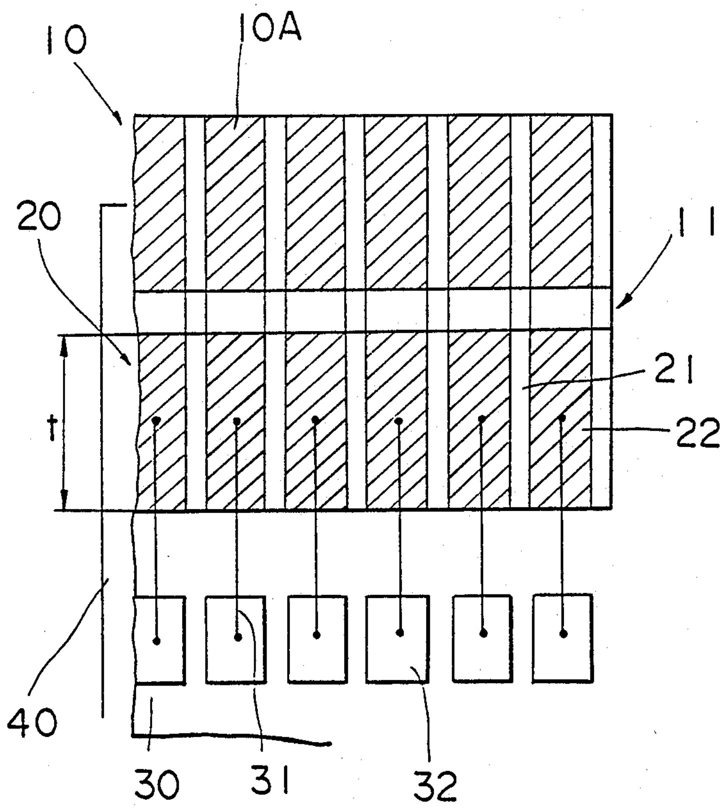
FIG. 3 is an enlarged fragmentary view of the ultrasonic probe shown in FIG. 1.

The PC boards 30 with the electrode patterns 32 are disposed underneath the auxiliary electrode plates 20, respectively. As shown in FIG. 3, the electrodes or elements 22 of the auxiliary electrode plate 20 and the electrodes 32 of the PC boards 30 are interconnected by the wires 31 by wire bonding.

Each of the auxiliary electrode plates 20 has a thickness t which should be calculated dependent on the radius of curvature of the ultrasonic probe. If the thickness t is about 0.3 mm, then the electrodes 22 may be spaced at intervals or gaps 21 of about 30 micrometers in the same manner as the piezoelectric vibrator 10, so that the radius of curvature of 5 mm can be achieved for the ultrasonic probe.

An acoustic matching layer (not shown) is disposed upwardly of the piezoelectric vibrator 10. The ultrasonic absorbent 40 is positioned below the piezoelectric vibrator 10.

Since the ultrasonic probe has the auxiliary electrode plates 20, the wires 31 do not present any obstacle to the acoustic matching layer. Inasmuch as the auxiliary electrode plate 20 and the piezoelectric vibrator 10 are divided into elements, they are sufficiently flexible.

A preferred process of manufacturing the ultrasonic probe will be described below with reference to FIGS. 4 through 8.

Figure 5A:
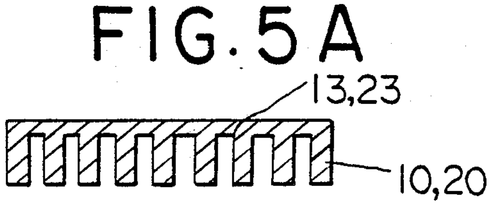
Figure 5B:
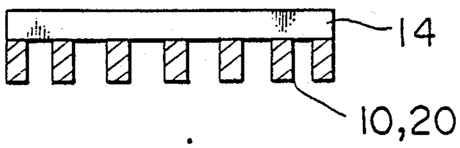

1st step:

First, a piezoelectric vibrator blank 10 and an auxiliary electrode plate blank 20 are joined to each other, and are divided into elements at desired pitches as shown in FIG. 3. The blanks 10, 20 may be divided in any of various ways. To prevent the divided elements from being scattered around or to keep them united, side portions 13,23 of the blanks 10, 20 may be left uncut as shown in FIG. 5A (in this case, the piezoelectric vibrator blank 10 must be flexible), or a single film comprising an acoustic matching layer 14 may be attached to the blanks 10, 20 to keep the divided elements together.

Figure 4:
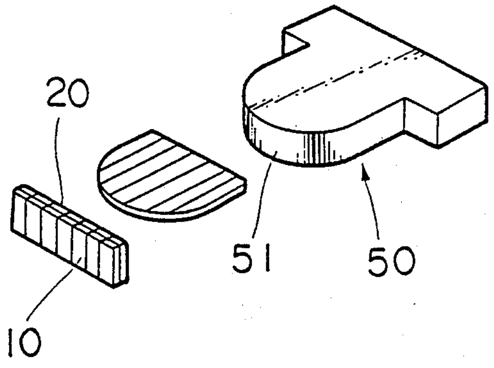
FIGS. 4, 5A, 5B, 6, 7, and 8 are views showing a process of manufacturing the ultrasonic probe.

2nd step:

As shown in FIG. 4, a heater 50 is provided which includes a nose 51 having a desired curved shape. The piezoelectric vibrator 10 and the auxiliary electrode plate 20 which have been divided in the 1st step are held against the curved shape of the noze 51 of the heater 50, as shown in FIG. 6.

Figure 6:
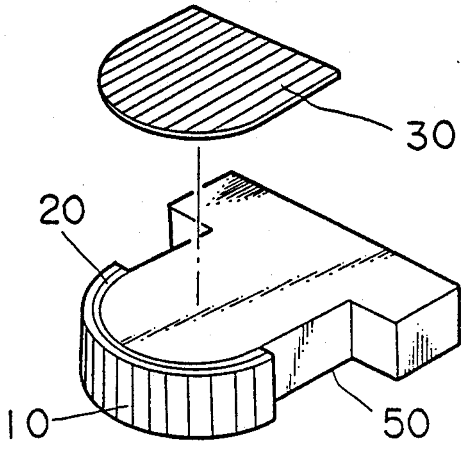

3rd step:

As shown in FIG. 6, a PC board 30 having a curved end is placed on the heater 50 from above. The PC board 30 should referably have a positioning hole or holes.

4th step:

Then, the heater 50 is heated. Alternatively, the heater 50 may be heated in advance. Where wire bonding is employed, it is necessary to heat the pad of a wire bonder with the heater 50 for allowing easy wire bonding. The heater 50 is also effective to enable the ultrasonic probe to have a prescribed curvature. This step is required when wire bonding for bonding gold wires is carried out, and may be dispensed with if aluminum wires are used in wire bonding.

Figure 7:
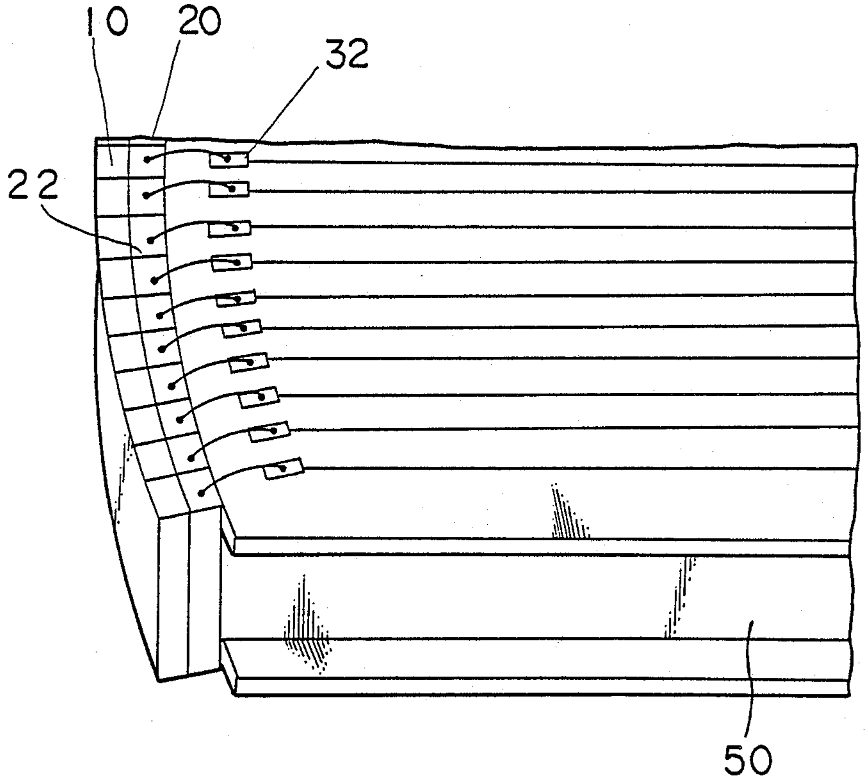

5th step:

When a preset temperature is reached, the electrodes 22 of the auxiliary electrode plate 20 and the electrodes 32 of the PC board 30 are connected to each other by gold wires on the wire bonder, as illustrated in FIG. 7.

Figure 8:
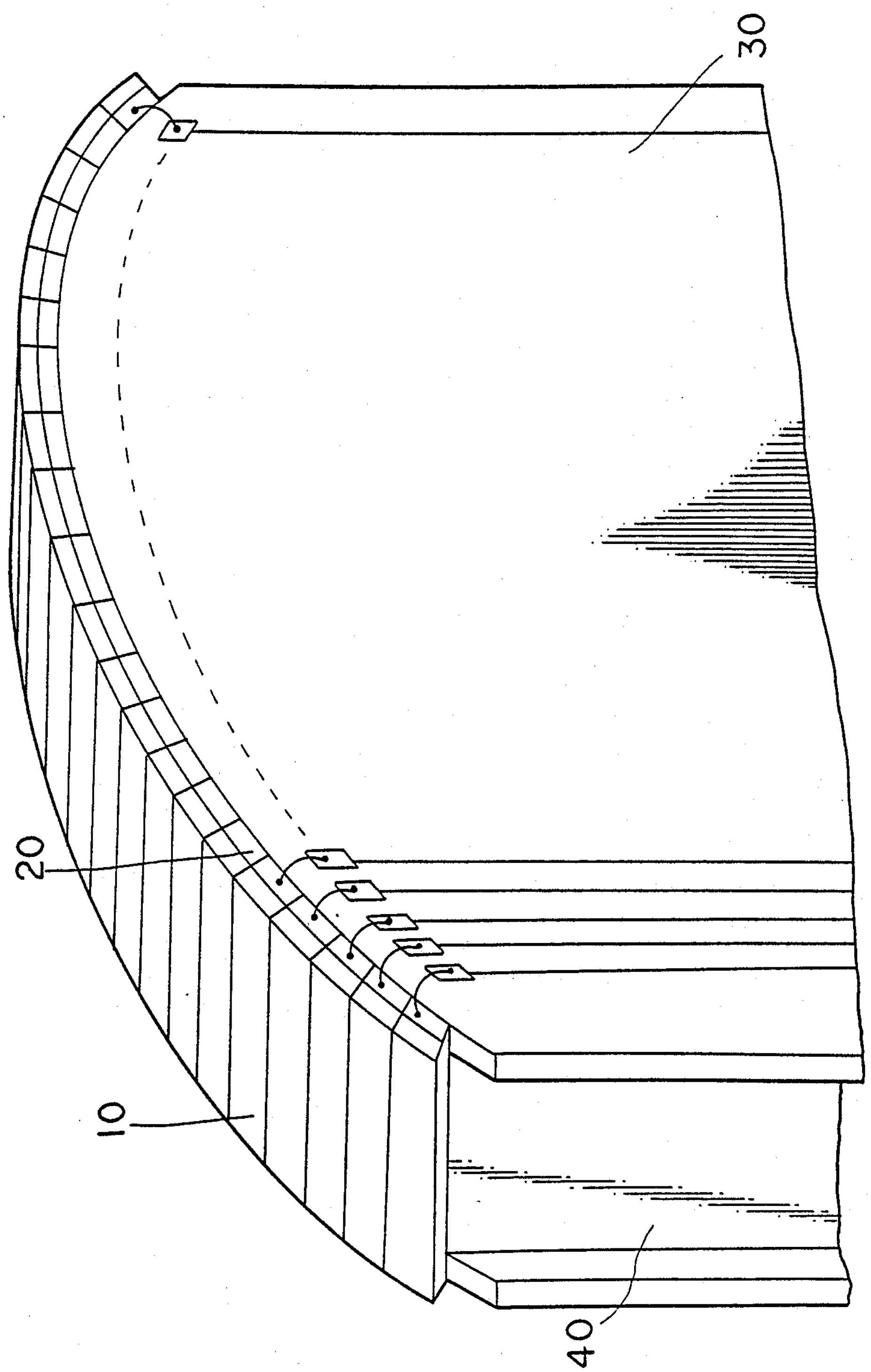

6th step:

Thereafter, the heater 50 is removed, and an ultrasonic absorbent 40 is placed beneath the piezoelectric vibrator 10, as shown in FIG. 8. Then, another PC board 30 is attached and a wire bonding process is carried out in the same manner as the above steps, thereby completing an ultrasonic probe.

According to the aforesaid manufacturing process, the desired shape of the piezoelectric vibrator of the probe can be obtained easily, and the pad of the wire bonder can smoothly be heated for wire bonding. Therefore, these steps can easily and effectively be carried out.

The gold wires employed by wire bonding to interconnect the electrodes are freely flexible in any directions. Consequently, the wire bonding process is highly effective in attaching wires to a piezoelectric vibrator which is complex in shape.

The principles of the present invention are also applicable to an ultrasonic probe having a flat distal end.

Figure 9A:
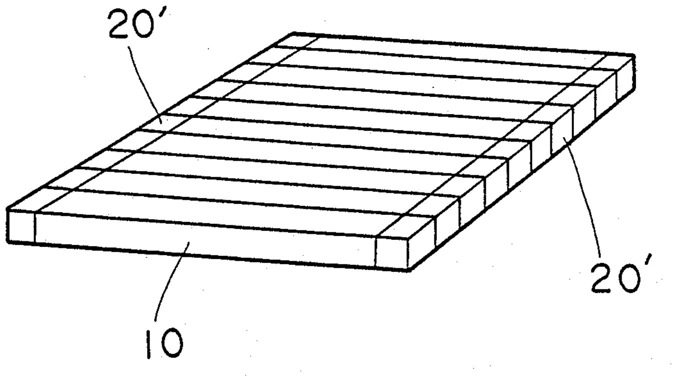
FIGS. 9A and 9B are perspective views of a modification of the invention.
Figure 9B:
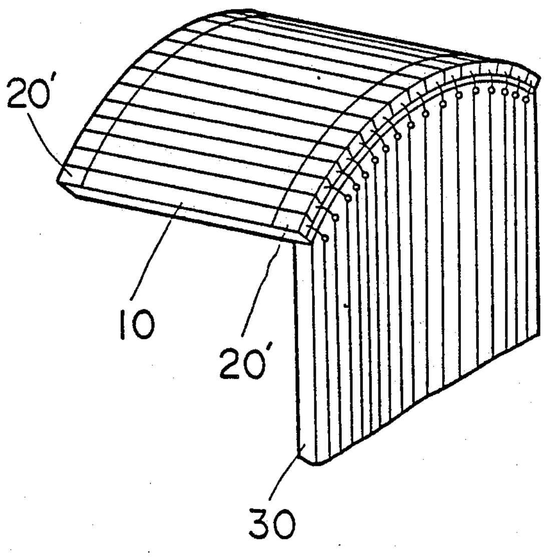
Figure 10:
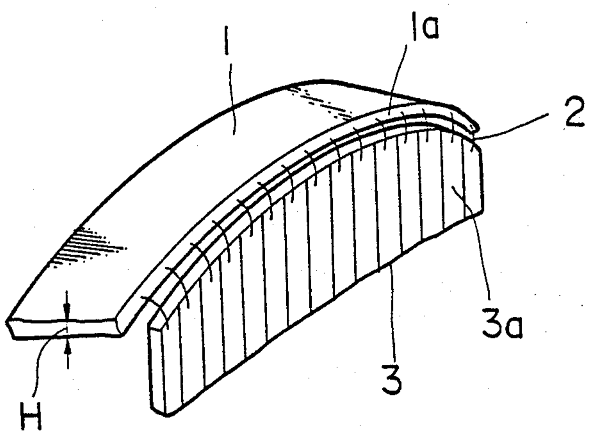
FIG. 10 PRIOR ART
FIGS. 10 through 12 are perspective views of conventional ultrasonic probes.
Figure 11:
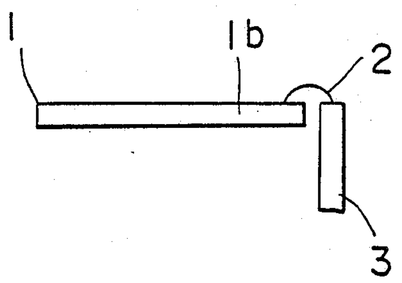
FIG. 11 PRIOR ART
Figure 12:
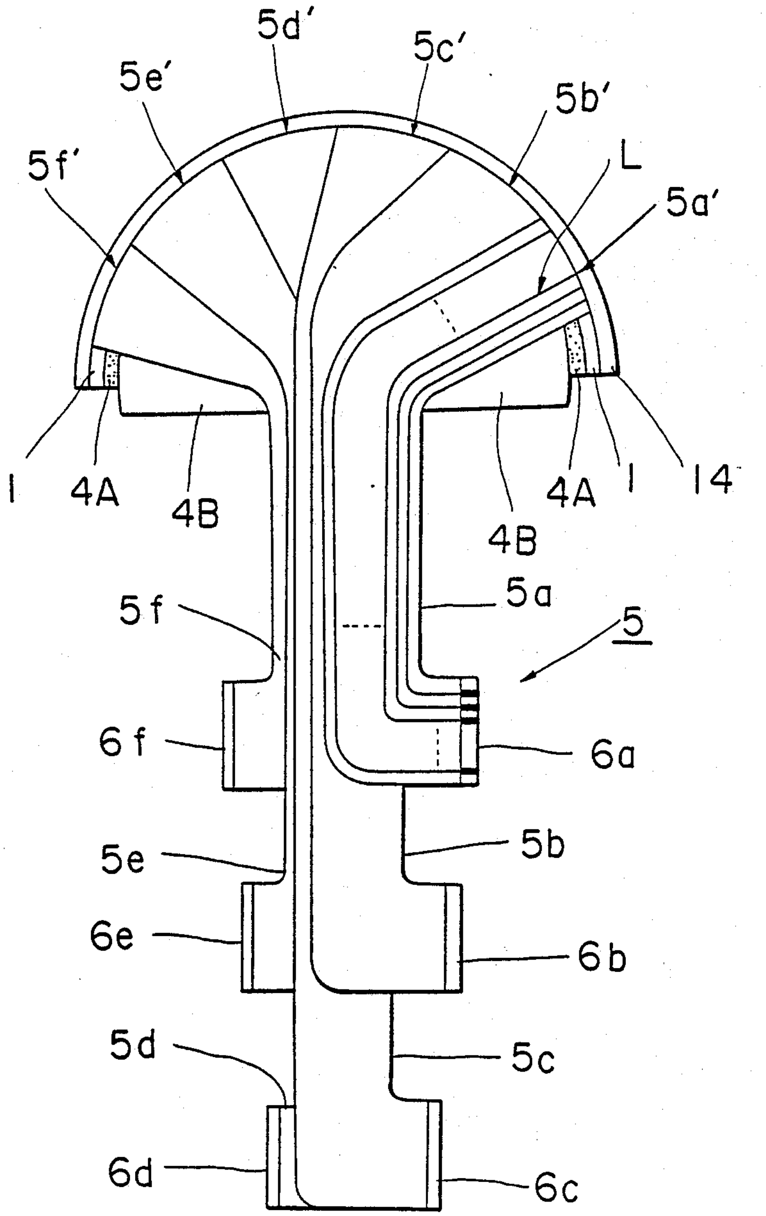
FIG. 12 PRIOR ART

As shown in FIG. 8, the auxiliary electrode plate 20 is centrally cut off so as to provide two auxiliary electrode plates 20 (FIG. 2) which underlie the four corners of the piezoelectric vibrator 10, as indicated by the broken lines in FIG. 8. However, as shown in FIG. 9A, two auxiliary electrode plates 20' lying flush with each other may be disposed one on each side of the piezoelectric vibrator 10 and attached by cream solder or electrically conductive paint. Then, the entire assembly is cut off to a sector pattern to provide a curved surface, as shown in FIG. 9B, then a PC board 30 is disposed at a side edge of the assembly, and wires are joined by wire bonding. Forces which are generated at the time of wire bonding are absorbed by the piezoelectric vibrator.

Although certain preferred embodiments have been shown and described, it should be understood that many changes and modifications may be made therein without departing from the scope of the appended claims.

We claim:

1. A method of manufacturing an ultrasonic probe, comprising the steps of: joining a piezoelectric vibrator blank and an auxiliary electrode plate blank having a plurality of electrode patterns to each other and then dividing said piezoelectric vibrator blank and said auxiliary electrode plate blank at prescribed pitches to produce a piezoelectric vibrator and an auxiliary electrode plate; bending said piezoelectric vibrator and said auxiliary electrode plate to a predetermined curvature; placing an electrode plate having a plurality of electrode patterns and a distal end curved to the same curvature as that of said auxiliary electrode plate, such that said curved distal end extends along said bent auxiliary electrode plate; and electrically connecting the electrode patterns of said auxiliary electrode plate respectively to the electrode patterns of said electrode plate.

* * * * *

UNITED STATES PATENT AND TRADEMARK OFFICE

CERTIFICATE OF CORRECTION

PATENT NO. : 4,894,895

DATED : JANUARY 23, 1990

INVENTOR(S) : HARUYASU ROKUROHTA and KAZUFUMI ISHIYAMA

It is certified that error appears in the above-identified patent and that said Letters Patent is hereby corrected as shown below:

ON TITLE PAGE:

In the Abstract, line 5, change "vibration" to --vibrator--;

Column 1, line 49, change "lamianted" to --laminated--;

Column 3, line 54, change "noze" to --nose--;

Column 3, line 59, change "referably" to --preferably--.

Signed and Sealed this

Twenty-seventh Day of August, 1991

Attest:

HARRY F. MANBECK, JR.

Attesting Officer

Commissioner of Patents and Trademarks